(12) United States Patent
Kamata

(10) Patent No.: US 8,487,614 B2
(45) Date of Patent: Jul. 16, 2013

(54) MAGNETIC RESONANCE IMAGING APPARATUS/METHOD COUNTER-ACTIVELY SUPPRESSING REMNANT EDDY CURRENT MAGNETIC FIELDS GENERATED FROM GRADIENTS APPLIED BEFORE CONTROLLING CONTRAST PRE-PULSES AND MRI IMAGE DATA ACQUISITION

(75) Inventor: Mitsukazu Kamata, Nasushiobara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 567 days.

(21) Appl. No.: 12/634,925

(22) Filed: Dec. 10, 2009

(65) Prior Publication Data

US 2010/0148774 A1    Jun. 17, 2010

(30) Foreign Application Priority Data

Dec. 17, 2008  (JP) .................................. 2008-321089

(51) Int. Cl.
*G01R 33/56518* (2006.01)

(52) U.S. Cl.
USPC ........................... 324/307; 324/318; 324/309

(58) Field of Classification Search
USPC .... 324/300–322; 600/407–435; 382/128–131
See application file for complete search history.

(56) References Cited

U.S. PATENT DOCUMENTS

| | | | | |
|---|---|---|---|---|
| 4,509,015 A * | 4/1985 | Ordidge et al. | | 324/309 |
| 4,647,858 A * | 3/1987 | Bottomley | | 324/320 |
| 4,918,386 A * | 4/1990 | Dumoulin et al. | | 324/309 |
| 6,181,134 B1 * | 1/2001 | Wald | | 324/307 |
| 6,331,777 B1 * | 12/2001 | Van Den Brink et al. | | 324/312 |
| 6,335,620 B1 * | 1/2002 | Weissenberger | | 324/307 |
| 6,483,305 B1 * | 11/2002 | Miyamoto | | 324/307 |
| 6,559,643 B2 * | 5/2003 | Miyoshi | | 324/307 |
| 6,628,116 B1 * | 9/2003 | Kraft et al. | | 324/309 |
| 6,853,188 B2 * | 2/2005 | Feinberg et al. | | 324/307 |
| 7,068,031 B2 * | 6/2006 | Miyoshi | | 324/307 |
| 8,374,675 B2 * | 2/2013 | Bi et al. | | 600/413 |
| 2002/0050817 A1 * | 5/2002 | Miyoshi | | 324/309 |
| 2003/0169042 A1 * | 9/2003 | Feinberg et al. | | 324/309 |
| 2005/0168221 A1 * | 8/2005 | Miyoshi | | 324/309 |

(Continued)

FOREIGN PATENT DOCUMENTS

| | | |
|---|---|---|
| JP | 06-261877 | 9/1994 |
| JP | 11-244256 | 9/1999 |
| JP | 2004-261591 | 9/2004 |
| WO | 03/037183 A1 | 5/2003 |

OTHER PUBLICATIONS

JP Office Action dated May 14, 2013 in JP 2008-321089.

*Primary Examiner* — Melissa Koval
*Assistant Examiner* — Tiffany Fetzner
(74) *Attorney, Agent, or Firm* — Nixon & Vanderhye PC

(57) ABSTRACT

A magnetic resonance imaging apparatus includes an imaging unit and a compensation unit. The imaging unit acquires image data by imaging that applies a pre-pulse for controlling contrast. The compensation unit suppresses a remnant magnetic field having an intensity according to slice position. The remnant magnetic field is at an application timing of the pre-pulse and due to an eddy current generated by at least one gradient magnetic field applied before applying the pre-pulse.

15 Claims, 13 Drawing Sheets

U.S. PATENT DOCUMENTS

2008/0129298 A1* 6/2008 Vaughan et al. ............. 324/322
2010/0148774 A1* 6/2010 Kamata ........................ 324/309
2010/0280357 A1* 11/2010 Bi et al. ........................ 600/419
2012/0013336 A1* 1/2012 Hetzer et al. ................. 324/309

* cited by examiner

| APPLICATION AXIS | AFFECTED AXIS | COEFFICIENTS OF APPROXIMATE EXPRESSION | TIME CONSTANT | SCALING FACTOR |
|---|---|---|---|---|
| X | X | $a_{xx1}, b_{xx1}, c_{xx1}$ | $T_{xx1}$ | $Sc_{xx1}$ |
| | Y | $a_{xy1}, b_{xy1}, c_{xy1}$ | $T_{xy1}$ | $Sc_{xy1}$ |
| | Z | $a_{xz1}, b_{xz1}, c_{xz1}$ | $T_{xz1}$ | $Sc_{xz1}$ |
| Y | X | $a_{yx1}, b_{yx1}, c_{yx1}$ | $T_{yx1}$ | $Sc_{yx1}$ |
| | Y | $a_{yy1}, b_{yy1}, c_{yy1}$ | $T_{yy1}$ | $Sc_{yy1}$ |
| | Z | $a_{yz1}, b_{yz1}, c_{yz1}$ | $T_{yz1}$ | $Sc_{yz1}$ |
| Z | X | $a_{zx1}, b_{zx1}, c_{zx1}$ | $T_{zx1}$ | $Sc_{zx1}$ |
| | Y | $a_{zy1}, b_{zy1}, c_{zy1}$ | $T_{zy1}$ | $Sc_{zy1}$ |
| | Z | $a_{zz1}, b_{zz1}, c_{zz1}$ | $T_{zz1}$ | $Sc_{zz1}$ |
| X | X | $a_{xx2}, b_{xx2}, c_{xx2}$ | $T_{xx2}$ | $Sc_{xx2}$ |
| | Y | $a_{xy2}, b_{xy2}, c_{xy2}$ | $T_{xy2}$ | $Sc_{xy2}$ |
| | Z | $a_{xz2}, b_{xz2}, c_{xz2}$ | $T_{xz2}$ | $Sc_{xz2}$ |
| Y | X | $a_{yx2}, b_{yx2}, c_{yx2}$ | $T_{yx2}$ | $Sc_{yx2}$ |
| | Y | $a_{yy2}, b_{yy2}, c_{yy2}$ | $T_{yy2}$ | $Sc_{yy2}$ |
| | Z | $a_{yz2}, b_{yz2}, c_{yz2}$ | $T_{yz2}$ | $Sc_{yz2}$ |
| Z | X | $a_{zx2}, b_{zx2}, c_{zx2}$ | $T_{zx2}$ | $Sc_{zx2}$ |
| | Y | $a_{zy2}, b_{zy2}, c_{zy2}$ | $T_{zy2}$ | $Sc_{zy2}$ |
| | Z | $a_{zz2}, b_{zz2}, c_{zz2}$ | $T_{zz2}$ | $Sc_{zz2}$ |

FIG. 8

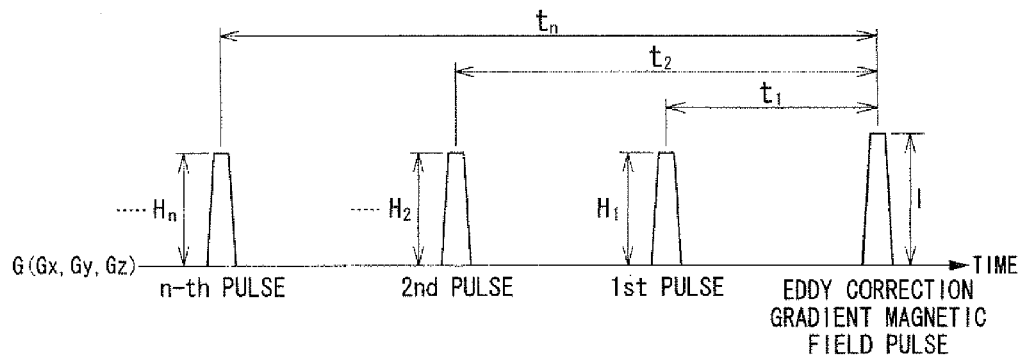

FIG. 9

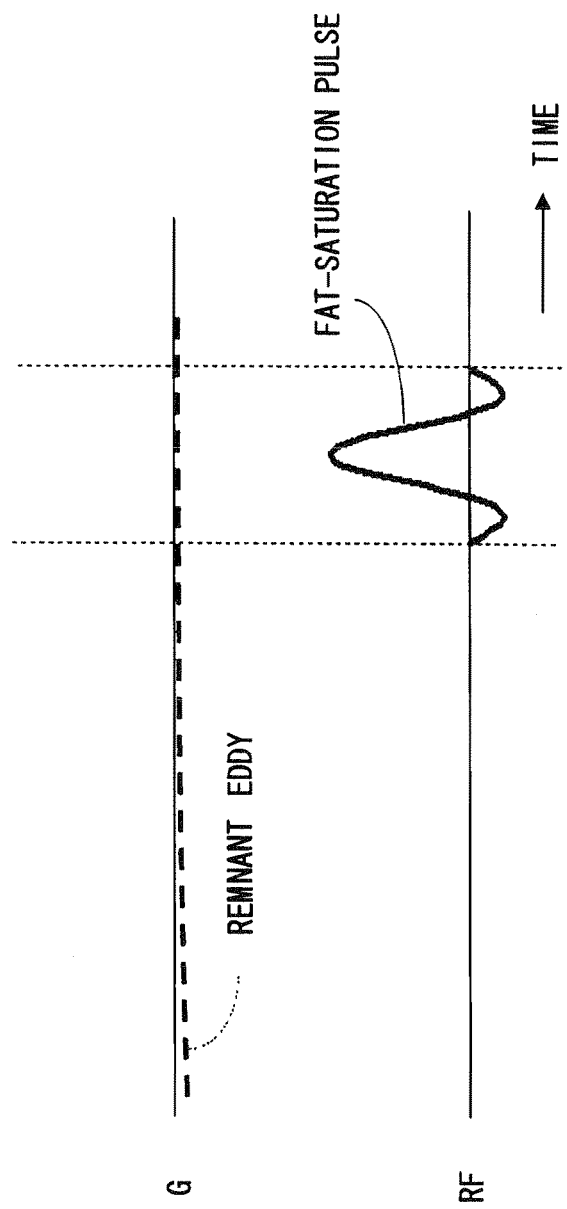

MAGNETIC RESONANCE IMAGING APPARATUS/METHOD COUNTER-ACTIVELY SUPPRESSING REMNANT EDDY CURRENT MAGNETIC FIELDS GENERATED FROM GRADIENTS APPLIED BEFORE CONTROLLING CONTRAST PRE-PULSES AND MRI IMAGE DATA ACQUISITION

BACKGROUND

1. Technical Field

The technology described below relates to a MRI (magnetic resonance imaging) apparatus and a magnetic resonance imaging method which excite nuclear spin of an object magnetically with a RF (radio frequency) signal having the Larmor frequency and reconstruct an image based on NMR (nuclear magnetic resonance) signals generated due to the excitation, and more particularly, to a magnetic resonance imaging apparatus and a magnetic resonance imaging method which make it possible to reduce influence by remnant magnetic fields due to eddy currents at the time of applying a pre-pulse for a desired object.

2. Description of Related Art

Magnetic Resonance Imaging is an imaging method which excites nuclear spin of an object set in a static magnetic field with an RF signal having the Larmor frequency magnetically and reconstructs an image based on NMR signals generated due to the excitation.

The fat suppression technique that suppresses MR signals from fat is known as one of contrast control techniques in the field of magnetic resonance imaging. Moreover, the technique that suppresses fat signals by applying a fat saturation pulse as a pre-pulse is known as one of fat suppression techniques. For example, there is a CHESS (chemical shift selective) technique that excites and saturates protons of fat by applying a 90° RF pulse that has a bandwidth matched with the resonance frequency of fat. Especially, in case of acquiring a MR image of a cross section of an object, the fat suppression technique that suppresses MR signals from fat as described above is essential since fat present in the section causes image degradation such as artifacts due to the chemical shift.

In addition, the technique that controls a contrast by applying a pre-pulse as described above is used for various purposes such as labeling as well as for fat suppression.

Meanwhile, at a rising edge and a falling edge of a gradient magnetic field applied in magnetic resonance imaging, an eddy current is induced on conductive parts of the MRI device due to a change in the gradient magnetic field. Accordingly, there is a problem that an artifact is generated in the image since a waveform of a gradient magnetic field to be applied is distorted due to a magnetic field generated by the induced eddy current.

Against this problem, a technique called pre-emphasis that outputs a gradient magnetic field with the addition of a gradient magnetic field having the polarity opposite to that of a gradient magnetic field generated by an eddy current in advance is known as a means to compensate for image degradation caused by an eddy current (see, for example, Japanese Publication of Patent Application No. 2001-258865). To be able to use the pre-emphasis, a time constant in attenuation and an intensity of an eddy current are necessary and these values are measured in advance. Note that, a time constant in attenuation and an intensity of an eddy current are specific to the MRI device.

However, the conventional compensation technique for an eddy current prevents generation of a remnant magnetic field due to the eddy current by applying the pre-emphasis to a waveform of a gradient magnetic field on the basis that a time constant in attenuation and an intensity of the eddy current are spatially uniform. Therefore, when a time constant in attenuation and an intensity of an eddy current vary spatially, a remnant magnetic field will be generated at positions where eddy currents different from a set value for the pre-emphasis are generated.

Specifically, an intensity of a remnant magnetic field, which should be corrected by applying the pre-emphasis, varies linearly in a single slice. However, an intensity of a remnant magnetic field becomes larger at a position more distant from the center of static magnetic field. Therefore, a gradient of remnant magnetic field intensity differs between slice positions. A change in a slice direction of a gradient of remnant magnetic field intensity becomes two-dimensional one and above.

Assuming that the above described change in gradient with a second order and above according to a slice position is referred to a second order and above of spatial distribution, a magnetic field generated by an eddy current has a second order of spatial distribution as well as a zero order and a first order of spatial distributions. Therefore, the effects of the zero order and the first order spatial distributions of a remnant magnetic field can be corrected by the pre-emphasis described above. However, it is difficult to correct the effects of the second order and above of spatial distributions completely by the pre-emphasis.

When the foregoing remnant magnetic field having a second order of spatial distribution due to an eddy current exists, fat tissue that has the resonance frequency different from a bandwidth of a fat saturation pulse is generated by the remnant magnetic field and the fat suppression effect is reduced. Especially, it has become a problem that the uniformity of a magnetic field at an off center is deteriorated by the effect of an eddy current having a second order of distribution and the fat suppression effect is reduced.

Therefore, in an imaging using a fat suppression technique such as the CHESS method, it is necessary to generate a uniform magnetic field to acquire an improved fat suppression effect. For that purpose, it is necessary to correct a remnant magnetic field, of which a time constant in attenuation and an intensity vary spatially, caused by an eddy current.

Similarly, when a pre-pulse is applied with a gradient magnetic field pulse having a predetermined intensity for a purpose other than the fat suppression, a gradient magnetic field with an intensity different from an original intensity of a gradient magnetic field to be generated at a timing of application of the pre-pulse is generated in case where a remnant magnetic field having a second order of spatial distribution due to an eddy current exists. Therefore, a remnant magnetic field due to an eddy current leads to degradation in accuracy of a contrast control by application of a pre-pulse. Accordingly, it is necessary to correct a remnant magnetic field caused by an eddy current at a timing of application of a pre-pulse to control a contrast.

SUMMARY

The present exemplary embodiments have been made in light of the conventional situations, and it is an object of the present invention to provide a magnetic resonance imaging apparatus and a magnetic resonance imaging method which make it possible to reduce influence by remnant magnetic fields generated due to eddy currents at a timing of applying a pre-pulse for controlling a contrast for imaging with the pre-pulse.

The present exemplary embodiments provide a magnetic resonance imaging apparatus comprising: an imaging unit configured to acquire image data by imaging with applying a pre-pulse for controlling a contrast; and a compensation unit configured to suppress a remnant magnetic field having an intensity according to a slice position, the remnant magnetic field being at an application timing of the pre-pulse and due to an eddy current generated by at least one gradient magnetic field applied before applying the pre-pulse, in an aspect to achieve the object.

The present exemplary embodiments also provide a magnetic resonance imaging method comprising: acquiring image data by imaging with applying a pre-pulse for controlling a contrast; and suppressing a remnant magnetic field having an intensity according to a slice position, the remnant magnetic field being at an application timing of the pre-pulse and due to an eddy current generated by at least one gradient magnetic field applied before applying the pre-pulse.

The magnetic resonance imaging apparatus and the magnetic resonance imaging method according to the present exemplary embodiments as described above make it possible to reduce influence by remnant magnetic fields generated due to eddy currents at a timing of applying a pre-pulse for controlling a contrast for imaging with the pre-pulse.

BRIEF DESCRIPTION OF THE DRAWINGS

In the accompanying drawings:

FIG. 8 is a table showing an example of parameters stored in the eddy current parameter storage part shown in FIG. 2;

FIG. 9 is a diagram explaining a method for calculating an intensity of the eddy correction gradient magnetic field pulse shown in FIG. 5 in a target axis direction;

FIG. 10 is a chart showing a gradient magnetic field at an application timing of a pre-pulse in case of compensating a remnant magnetic field due to an eddy current by the eddy compensation circuit shown in FIG. 1;

DESCRIPTION OF THE PREFERRED EMBODIMENTS

A magnetic resonance imaging apparatus and a magnetic resonance imaging method according to embodiments of the present invention will be described with reference to the accompanying drawings.

(Configuration and Function)

Figure 1:
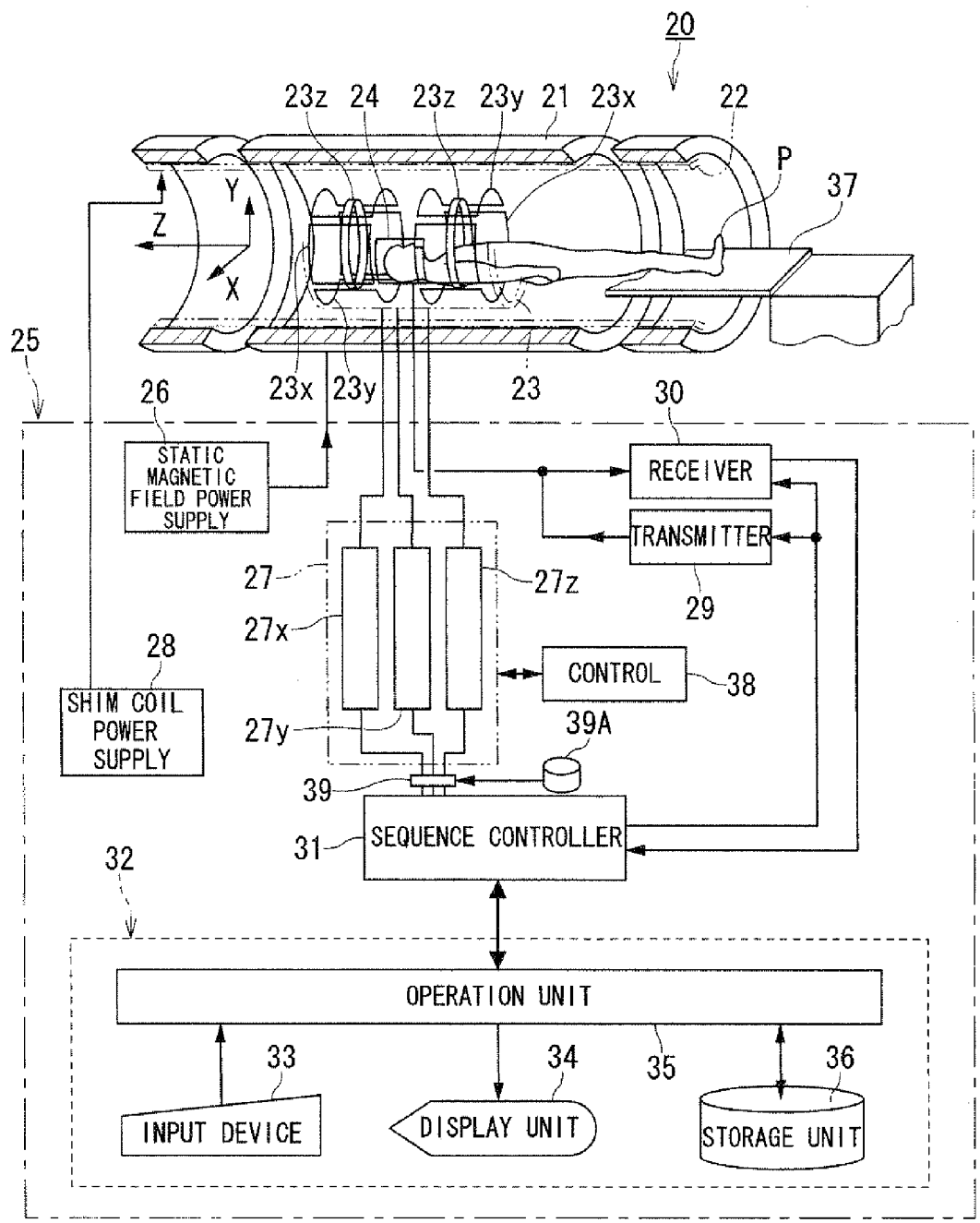
FIG. 1 is a block diagram showing a magnetic resonance imaging apparatus according to an embodiment of the present invention.

FIG. 1 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and RF coils 24.

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, an operation unit 35 and a storage unit 36.

The static field magnet 21 communicates with the static magnetic field power supply 26. The static magnetic field power supply 26 supplies electric current to the static field magnet 21 to get the function to generate a static magnetic field in an imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. The RF coils 24 include a whole body coil (WBC: whole body coil), which is built in the gantry, for transmission and reception of RF signals and local coils, which are arranged around the bed 37 or the object P, for reception of RF signals.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

Further, a gradient power supply control computer 38 and an eddy compensation circuit 39 are connected to the gradient power supply 27. The eddy compensation circuit 39 is connected to an eddy compensation parameter database 39A.

The gradient power supply control computer 38 has the function to refer to a pulse sequence acquired from the sequence controller 31 or the gradient power supply 27 and control a pulse waveform output from the gradient power supply 27 by providing a control signal to the gradient power supply 27. Especially, the gradient power supply control computer 38 has the function to control the gradient power supply 27 so that an eddy correction gradient magnetic field pulse, by which a remnant magnetic field due to an eddy current having a more than first order of spatial distribution generated caused by applications of gradient magnetic fields before an application of a pre-pulse that is one of RF signals transmitted from the RF coil 24 is canceled, is applied from the gradient magnetic field coil 23 at the application timing of the pre-pulse. For that purpose, parameters, with regard to eddy currents each having a more than first order of spatial distribution, stored in the eddy compensation parameter database 39A described below and in the computer 32, are stored in the gradient power supply control computer 38. The parameters are referenced by the gradient power supply control computer 38 for calculating an intensity and an application timing of an eddy correction gradient magnetic field pulse.

The method for determining an application timing and an intensity of an eddy correction gradient magnetic field pulse is similar to that of the computer 32 described below and the explanation thereof is omitted here. The gradient power supply control computer 38 has the function to set and apply an eddy correction gradient magnetic field pulse in real time following applications of gradient magnetic field pulses for data acquisition by controlling the gradient power supply 27 during an imaging.

Note that, the computer 32 may have the function of the gradient power supply control computer 38 described above instead of equipping with the gradient power supply control computer 38.

The eddy compensation parameter database 39A stores respective axis components of an intensity of an eddy current generated when a unit intensity of gradient magnetic field is applied or coefficients for calculating the respective axis components and scaling factors in addition to the time constants of attenuation of an eddy current as parameters.

These parameters are stored separately depending on whether an eddy current has only zero and first orders of spatial distributions or an eddy current has a more than first order of spatial distribution. The information on an eddy current having a more than first order of spatial distribution is similar to the information stored in the computer 32 described below and includes parameters nonlinearly-changing according to spatial positions. The parameters on an eddy current can be acquired by performing an eddy measuring sequence described below.

The eddy compensation circuit 39 has function to refer to a pulse sequence acquired from the sequence controller 31 to correct a waveform of a gradient magnetic field pulse set as an imaging condition on the pulse sequence so as to prevent a remnant magnetic field caused by an eddy current occurring due to applied gradient magnetic fields, and to output the corrected gradient magnetic field pulse to the gradient power supply 27 to control the gradient power supply 27 so that gradient magnetic fields, by which a remnant magnetic field caused by an eddy current is not generated, are applied from the gradient magnetic field coil 23. Especially, the eddy compensation circuit 39 has a first mode to prevent an eddy current having a zero or first order of spatial distribution and a second mode to prevent an eddy current having a more than first order of spatial distribution that are switchable. Thus, the eddy compensation circuit 39 is configured to reference the eddy compensation parameter database 39A to calculate corrected waveforms of gradient magnetic field pulses, by which an eddy current is not generated, based on information on an eddy current such as a time constant of attenuation and an intensity of a corresponding eddy current in each mode.

On the other hand, the RF coils 24 communicate with the transmitter 29 and/or the receiver 30. The transmission RF coil 24 has a function to transmit a RF signal given from the transmitter 29 to the object P. The reception RF coil 24 has a function to receive an MR signal generated due to a nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D (analog to digital) conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a MR signal given from the RF coil 24 and performing predetermined signal processing and A/D converting to the MR signal detected. The receiver 30 also has a function to give the generated raw data to the sequence controller 31.

The computer 32 gets various functions by the operation unit 35 executing some programs stored in the storage unit 36 of the computer 32.

Alternatively, some specific circuits having various functions may be provided with the magnetic resonance imaging apparatus 20 instead of using some of the programs.

Figure 2:
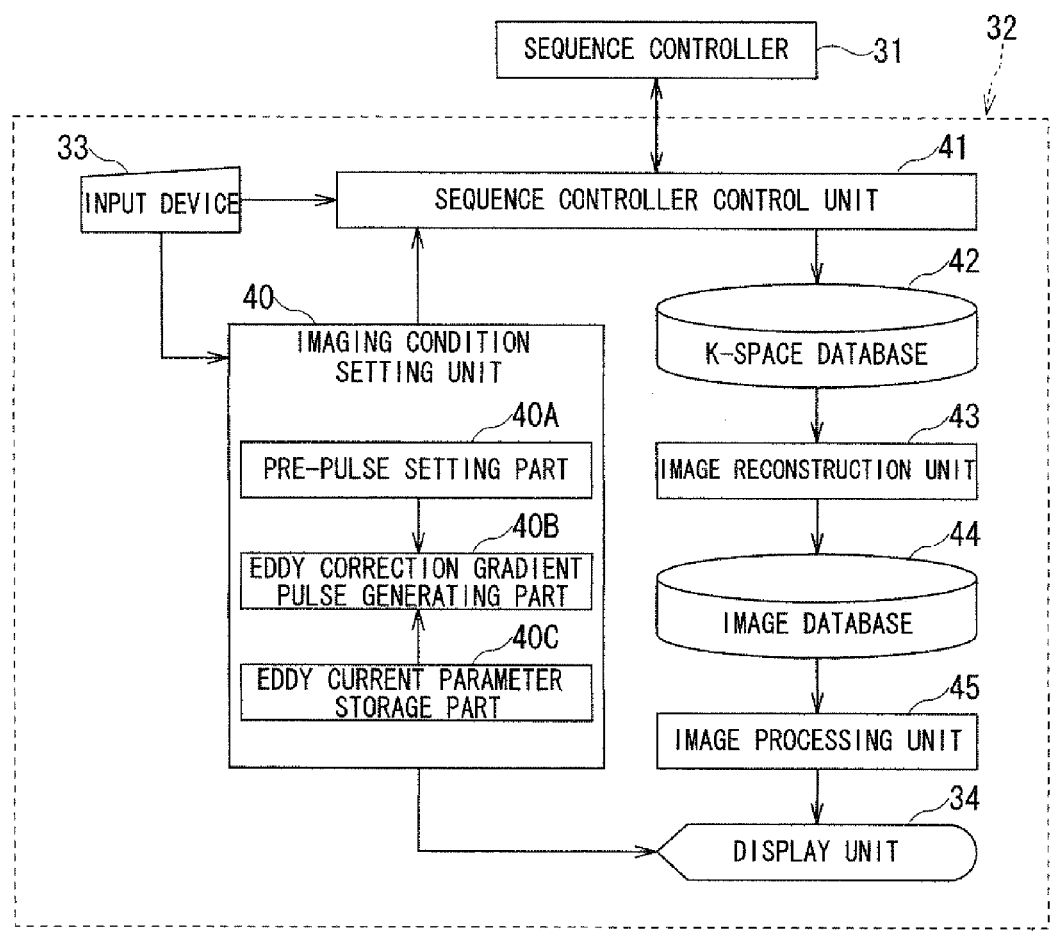
FIG. 2 is a functional block diagram of the computer shown in FIG. 1.

FIG. 2 is a functional block diagram of the computer 32 shown in FIG. 1.

The computer 32 functions as an imaging condition setting unit 40, a sequence controller control unit 41, a k-space database 42, an image reconstruction unit 43, an image database 44 and an image processing unit 45 by program. The imaging condition setting unit 40 has a pre-pulse setting part 40A, an eddy correction gradient pulse generating part 40B and an eddy current parameter storage part 40C.

The imaging condition setting unit 40 has a function to set an imaging condition including a pulse sequence based on instructions from the input device 33 and to provide the set imaging condition to the sequence controller control unit 41.

The pre-pulse setting part 40A of the imaging condition setting unit 40 has a function to set applying a pre-pulse for controlling a contrast. Pre-pulses for controlling contrasts include a selective excitation pulse such as a water selective excitation pulse, a suppression pulse such as a fat saturation pulse and a silicone suppression pulse, a spin labeling (also referred to tagging or labeling) pulse such as a SORS (slice-selective off-resonance sinc pulse), a t-SLIP (TIME-SLIP: time-Spatial Labeling Inversion Pulse) and an ASL (Arterial spin labeling) pulse, a MTC (magnetization transfer contrast pulse and a (pre) saturation (presat: presaturation) pulse.

The water selective excitation pulse is a pre-pulse to excite water selectively and the fat saturation pulse is a pre-pulse to suppress a fat. Some selective excitation pulses and suppression pulses such as a water selective excitation pulse and a fat saturation pulse use chemical shift that a resonant frequency is different from that of another matter. An example of fat saturation pulse using chemical shift is a CHESS pulse.

The spin labeling pulse is a pre-pulse for tagging a moving object such as blood and cerebrospinal fluid (CSF) flowing into an imaging section. Especially, a spin labeling pulse for labeling spins of blood is called an ASL pulse. There is a t-SLIP with application of plural pulses for labeling as one of spin labeling pulses.

A t-SLIP is configured with a region non-selective inversion pulse and a region selective inversion pulse. A region non-selective inversion pulse can be switched into ON/OFF state. That is, a t-SLIP includes at least a region selective inversion pulse, and is configured with only a region selective inversion pulse, or alternatively, with both of a region selective inversion pulse and a region non-selective inversion pulse.

A region selective inversion pulse can be set arbitrarily independent of an imaging section. When blood flowing into an imaging region is labeled with a region selective inversion pulse, signal intensity at the part to which the blood reaches after an inversion time (TI) becomes high. Note that, when a region non-selective inversion pulse is set to OFF, signal intensity at the part to which the blood reaches after a TI becomes low. Therefore, a moving direction and a distance of blood can be recognized. That is, signal intensity of only blood which reaches to an imaging section after a TI can be enhanced or suppressed selectively.

A presat pulse is a pre-pulse for suppressing signals from a desired matter by saturating spins of the desired matter. A presat pulse is applied before an application of a dephasing gradient magnetic field. A MTC pulse is a pre-pulse for saturating a magnetization of absorbed water protons by using MTC effect to suppress signals from a parenchymatous organ. A SORS is a MTC pulse applied with a slice selective gradient magnetic field.

The eddy correction gradient pulse generating part 40B of the imaging condition setting unit 40 has the function to set an eddy correction gradient magnetic field pulse so that a remnant magnetic field due to an eddy current, having a more than first order of nonuniform spatial distribution, i.e., varying nonlinearly according to a change of position, generated by applications of gradient magnetic fields before application of a pre-pulse is canceled at an application timing of the pre-pulse. The eddy correction gradient magnetic field pulse is applied before an application of pre-pulse or at an application timing of pre-pulse. Note that multiple eddy correction gradient magnetic field pulses may be applied as necessary so that a gradient magnetic field having an intended intensity (area) is formed.

Figure 3:
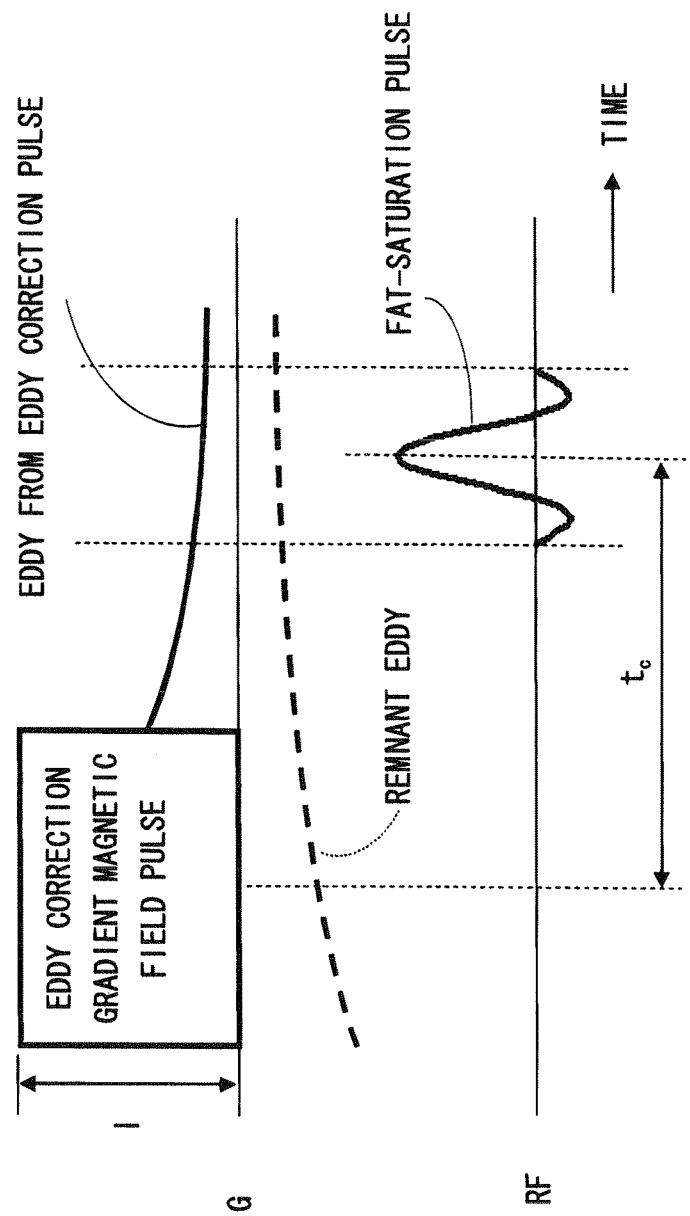
FIG. 3 is a diagram showing an example of an eddy correction gradient magnetic field pulse, set by the eddy correction gradient pulse generating part shown in FIG. 2, before applying a pre-pulse.

FIG. 3 is a diagram showing an example of an eddy correction gradient magnetic field pulse, set by the eddy correction gradient pulse generating part 40B shown in FIG. 2, before applying a pre-pulse.

In FIG. 3, the abscissa axis denotes time. Further, in FIG. 3, G represents an eddy correction gradient magnetic field pulse and RF represents a fat saturation pulse as an example of a pre pulse.

When a remnant gradient magnetic field shown by a dotted line in FIG. 3 exists due to an eddy current, the eddy correction gradient magnetic field pulse can be applied prior to application of the fat saturation pulse so that a gradient magnetic field having the polarity opposite to that of the remnant gradient magnetic field remains at the application timing of the fat saturation pulse. Specifically, the application of the eddy correction gradient magnetic field pulse having a predetermined intensity I is set at a timing earlier than the application timing of the pre-pulse by a predetermined time $t_c$. As a result, a gradient magnetic field for correction generated by application of the eddy correction gradient magnetic field pulse and the remnant magnetic field due to the eddy current cancel each other and the gradient magnetic field substantially becomes zero at the application timing of the fat saturation pulse.

If the remnant magnetic field due to the eddy current is compensated in this way, the compensating effect of the remnant magnetic field can be acquired without being affected by nonlinearity of the remnant magnetic field due to the eddy current although the remnant magnetic field due to the eddy current has exactly a temporally and spatially nonlinear characteristic. Specifically, since this is a compensation by the remnant magnetic field having nonlinear characteristic similar to that of the eddy current due to the eddy correction gradient magnetic field pulse, the remnant magnetic fields cancel each other and the effect of nonlinearity of the remnant magnetic field can be avoided. Thus, an improved fat suppression effect can be acquired.

Note that, although a gradient magnetic field pulse is not applied at the same timing as the fat saturation pulse and the gradient magnetic field is assumed to be zero at the application timing of the fat saturation pulse, in case where a pre-pulse is applied with a gradient magnetic field pulse, the intensity and the application timing of the eddy correction gradient magnetic field pulse are set so that a gradient magnetic field having an intensity originally required by the gradient magnetic field pulse applied with the pre-pulse is acquired by cancellation of a remnant magnetic field due to an eddy current. The same applies to the following.

Figure 4:
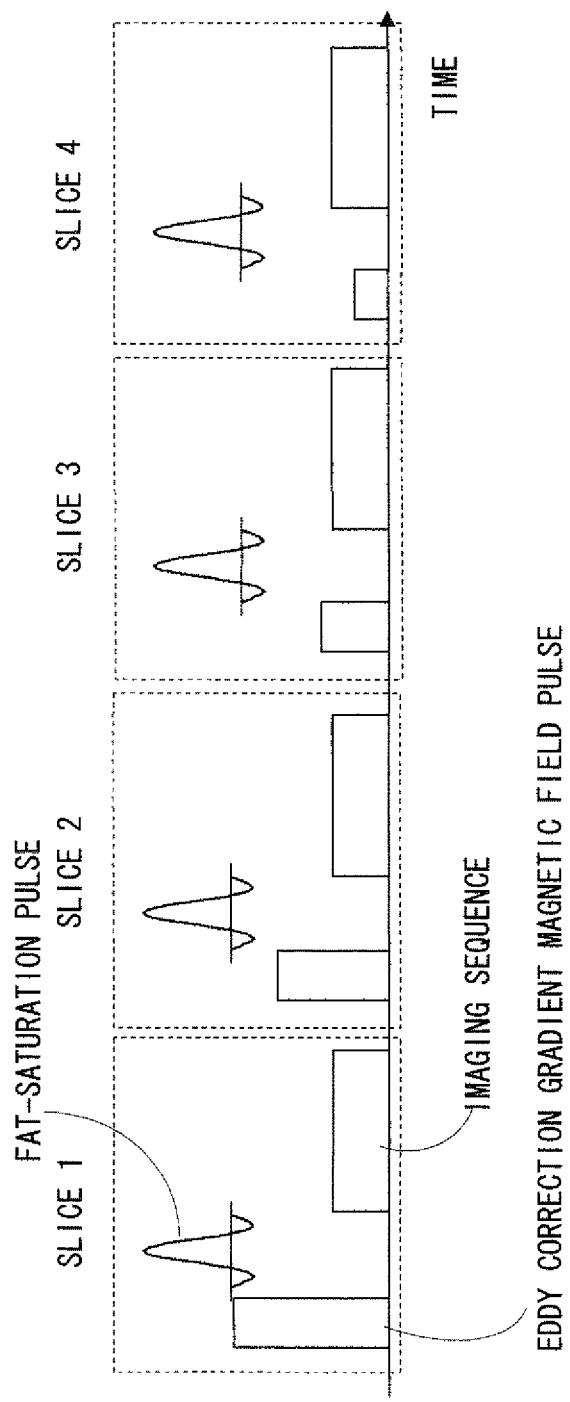
FIG. 4 is a sequence chart with setting the eddy correction gradient magnetic field pulse shown in FIG. 3.

FIG. 4 is a sequence chart with setting the eddy correction gradient magnetic field pulse shown in FIG. 3.

In FIG. 4, the abscissa axis denotes time. As shown in FIG. 4, in case of performing a multi-slice imaging, a pulse sequence is set so that a fat saturation pulse is applied for each slice and subsequently data on the corresponding slice is acquired by performing an imaging sequence. An arbitrary type of sequence can be used as the imaging sequence. Since gradient magnetic field pulses for data acquisition and a predetermined purpose are applied respectively in each imaging sequence and an associated sequence, a remnant magnetic field due to an eddy current is generated at the start of a subsequent sequence. Accordingly, application of an eddy correction gradient magnetic field pulse having an intensity required to cancel the remnant magnetic field is set prior to the fat saturation pulse in a sequence corresponding to each slice.

Figure 5:
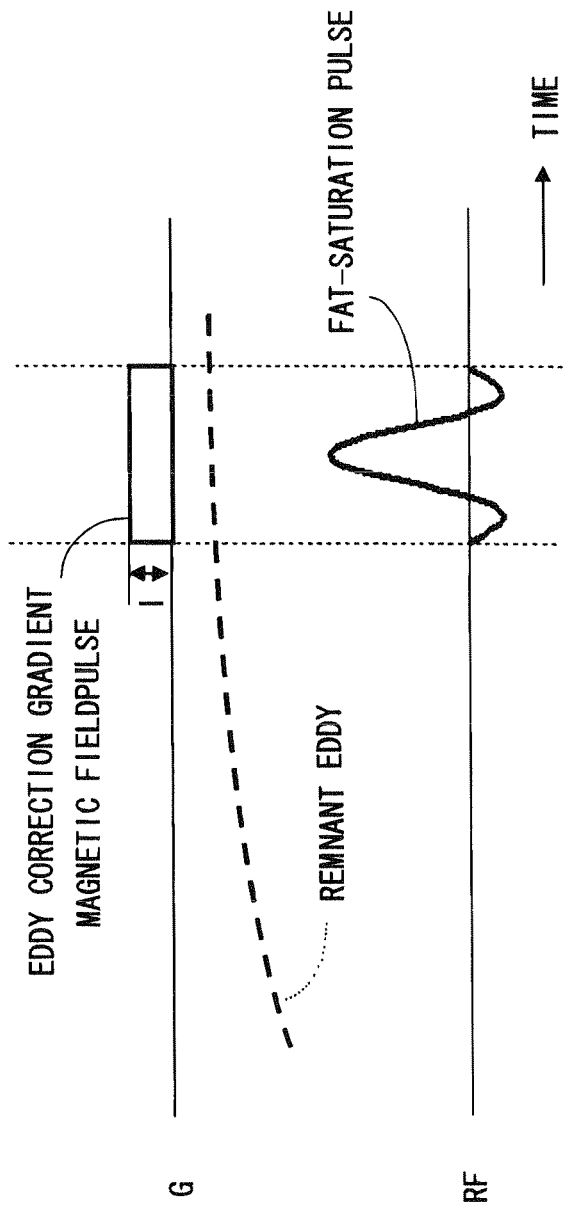
FIG. 5 is a diagram showing an example of an eddy correction gradient magnetic field pulse, set by the eddy correction gradient pulse generating part shown in FIG. 2, at the same timing as that of applying a pre-pulse.

FIG. 5 is a diagram showing an example of an eddy correction gradient magnetic field pulse, set by the eddy correction gradient pulse generating part 40B shown in FIG. 2, at the same timing as that of applying a pre-pulse.

In FIG. 5, the abscissa axis denotes time. Further, in FIG. 5, G represents an eddy correction gradient magnetic field pulse and RF represents a fat saturation pulse as an example of a pre pulse.

When a remnant gradient magnetic field exists due to an eddy current shown by a dotted line in FIG. 5, the eddy correction gradient magnetic field pulse having an intensity I that can be regarded to be equivalent to that of the remnant gradient magnetic field and having the polarity opposite to that of the remnant gradient magnetic field can be applied at the application timing of the fat saturation pulse. To be precise, since the remnant gradient magnetic field due to the eddy current attenuates nonlinearly, the intensity I of the eddy correction gradient magnetic field pulse can be determined based on a value such as an average intensity, a median value of intensity or an integral value of intensity of the remnant magnetic field during a time period during which the fat saturation pulse is being applied for example. As a result, a gradient magnetic field for correction generated by application of the eddy correction gradient magnetic field pulse and the remnant magnetic field due to the eddy current cancel each other and the gradient magnetic field substantially becomes zero at the application timing of the fat saturation pulse.

If the remnant magnetic field due to the eddy current is compensated in this way, advantages that it is not necessary to calculate the application timing of the eddy correction gradient magnetic field pulse and that it is easy to calculate the intensity of the eddy correction gradient magnetic field are achieved, compared to the case where the eddy correction gradient magnetic field pulse is applied prior to the fat saturation pulse as shown in FIG. 3.

Figure 6:
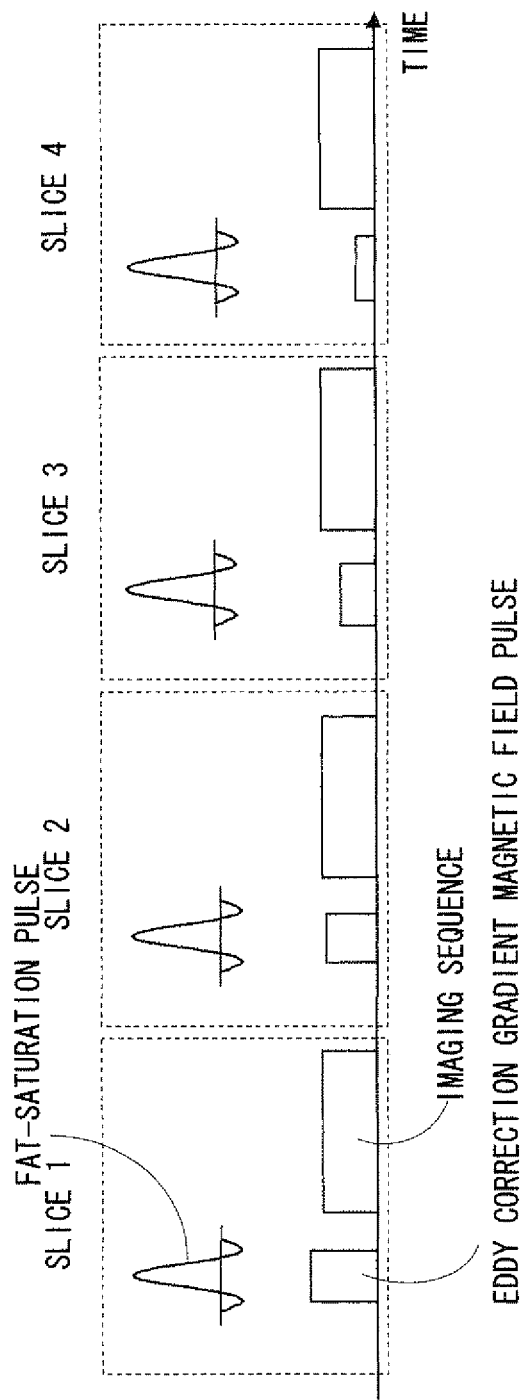
FIG. 6 is a sequence chart with setting the eddy correction gradient magnetic field pulse shown in FIG. 5.

FIG. 6 is a sequence chart with setting the eddy correction gradient magnetic field pulse shown in FIG. 5.

In FIG. 6, the abscissa axis denotes time. As shown in FIG. 6, in case of performing a multi-slice imaging, a pulse sequence is set so that a fat saturation pulse is applied for each slice and subsequently data on a corresponding slice is acquired by performing an imaging sequence. Accordingly, the application of the eddy correction gradient magnetic field pulse having an intensity required to cancel the remnant magnetic field is set at the same timing as that of the fat saturation pulse in a sequence corresponding to each slice.

Next, how to calculate an intensity I of eddy correction gradient magnetic field pulse will be described.

Since an intensity I of eddy correction gradient magnetic field pulse has X-axis direction component Ix, Y-axis direction component Iy and Z-axis direction component Iz, it is necessary to calculate components in the X-axis direction, the Y-axis direction and the Z-axis direction of eddy currents distributing on a space including positions of imaging sections (slices) in order to calculate the intensity I(Ix, Iy, Iz) of the eddy correction gradient magnetic field pulse.

The component, in each axial direction, of an eddy current, having a more than first order spatial distribution, generated in the case of applying a gradient magnetic field having a unit intensity can be approximated with using a high order expression. Practically, the component of an eddy current in each axial direction can be approximated by a quadratic expression or a three order expression. For example, the component rz, in a Z-axis direction, of an intensity r(rx, ry, rz) of an eddy current generated in the case of applying a gradient magnetic field having a unit intensity can be approximated with using a quadratic expression with regard to a spatial position Z in the Z axis direction as expression (1).

$$rz = Sc(aZ^2 + bZ + c) \quad (1)$$

In expression (1), a, b and c are coefficients for respective terms and Sc is a scaling factor. These coefficients a, b and c and the scaling value Sc are determined depending on characteristics of an apparatus. The scaling factor Sc may have plural values depending on characteristics of an apparatus. This is the same for an X-axis direction and a Y-axis direction.

Note that, the components rx, ry, rz of intensity of the eddy current in the respective axes may be approximated with a V-shaped linear-approximated line for easing calculation.

On the other hands, an intensity R(t) of an eddy current at a time point after a time t from applying a gradient magnetic field pulse having an intensity H(Hx, Hy, Hz) is expressed as expression (2).

$$R(t) = rH \exp(-t/T) \quad (2)$$

In expression (2), T(Tx, Ty, Tz) is a time constant of attenuation of an eddy magnetic field. The time constant T is also determined as a pair of parameters with a scaling factor Sc depending on characteristics of an apparatus.

These coefficients a, b and c, a scaling factor Sc and/or a time constant T for obtaining an intensity R(t) of an eddy current can be measured, parameterized and stored by a test imaging in advance at setting up the apparatus or before imaging. In the case of existing plural (the number n of) time constants, the coefficients become sets of Tn, an, bn, cn and Scn.

For example, a FFE (fast field echo) sequence that applies a gradient magnetic field pulse to generate an eddy current can be used as an eddy measuring sequence to measure a spatial distribution of eddy current.

Figure 7:
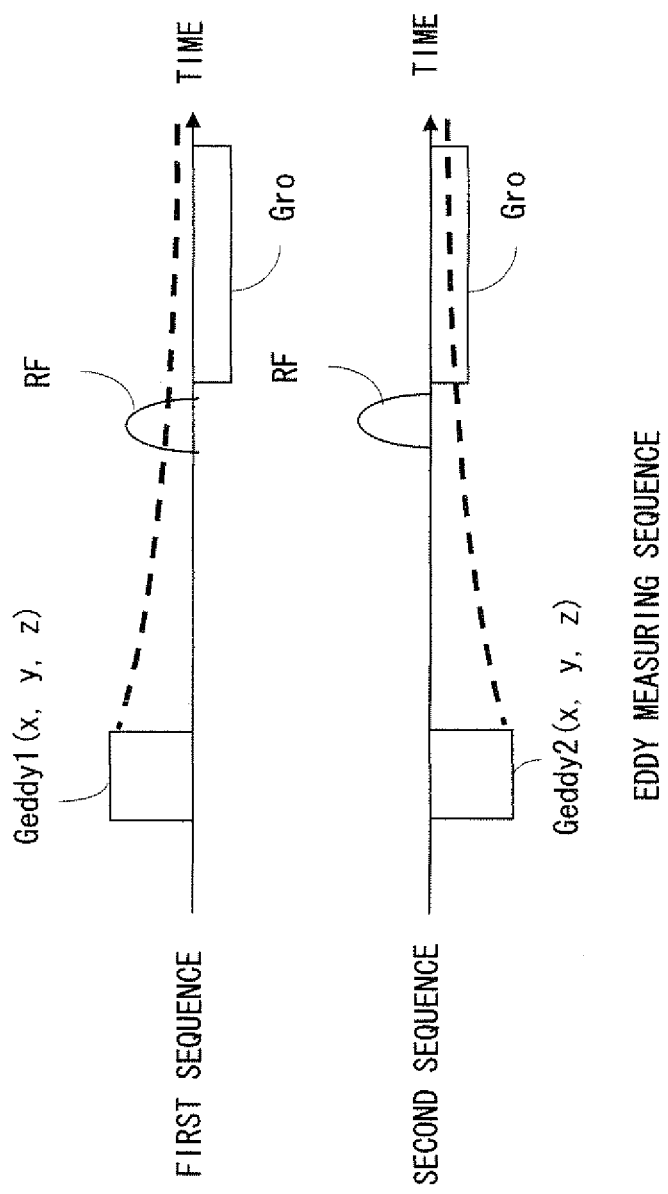
FIG. 7 is a conceptual diagram showing an eddy measuring sequence for acquiring information, with regard to an eddy current having a more than first order of spatial distribution, which is necessary for determining an intensity of eddy correction gradient magnetic field pulse set by the eddy correction gradient pulse generating part shown in FIG. 2.

FIG. 7 is a conceptual diagram showing an eddy measuring sequence for acquiring information, with regard to an eddy current having a more than first order of spatial distribution, which is necessary for determining an intensity of eddy correction gradient magnetic field pulse set by the eddy correction gradient pulse generating part 40B shown in FIG. 2.

In FIG. 7, the abscissa axis denotes time. As shown in FIG. 7, the eddy measuring sequence consists of the first sequence and the second sequence. The first sequence applies a gradient magnetic field Geddy1(x, y, z) and the second sequence applies the gradient magnetic field Geddy2(x, y, z), in order to generate eddy currents prior to data acquisition, respectively. The gradient magnetic field Geddy1(x, y, z) and the gradient magnetic field Geddy2(x, y, z) have mutually opposite polarities. The first sequence and the second sequence have a same RF pulse and a same readout gradient magnetic field Gro. The time constant T and the intensity R(t) of an eddy current or a function for calculating the time constant T and the intensity R(t) can be acquired based on a difference between pieces of data acquired by performing this eddy measuring sequence. Further, it is possible to calculate and store the intensity r(rx, ry, rz) of eddy current at each spatial position directly by performing the eddy measuring sequence instead of the coefficients a, b, c, the scaling factor Sc and the time constant T.

Note that, when a gradient magnetic field is applied to a certain axis, eddy currents also occur in other axis directions. Therefore, each coefficient of high order expressions with regard to three axis directions influenced in the case of applying a gradient magnetic field in one axis direction is necessary for calculating components of eddy currents. Since application axes of a gradient magnetic field include three axis directions of X, Y and Z and axes influenced by a gradient magnetic field in each axis direction are three axis directions of X, Y and Z, a total of sets of coefficients in nine high order expressions are parameters to be obtained in advance.

As mentioned above, it is necessary to store parameters such as coefficients a, b and c, scaling factors Sc and attenuation time constants T of eddy magnetic fields for calculating components R(Rx, Ry, Rz, t) in the respective axis directions of a eddy current generated in the case of applying a gradient magnetic field having a certain intensity H. That is, component of an eddy current in each axis direction can be expressed by using coefficient values in respective terms of a high order expression including cross terms, a scaling factor and an attenuation time constant of an eddy magnetic field as parameters.

These parameters for calculating an eddy current value in each axis direction every imaging position are stored in the eddy current parameter storage part 40C and the eddy correction gradient pulse generating part 40B is configured to be able to refer to the parameters in the eddy current parameter storage part 40C.

FIG. 8 is a table showing an example of parameters stored in the eddy current parameter storage part 40C shown in FIG. 2.

FIG. 8 shows sets of parameters stored in the eddy current parameter storage part 40C in the case of approximating a component in each axis direction of an eddy current by a quadratic expression. That is, each of totally nine sets of parameters for application axes of a gradient magnetic field and influenced axes is stored as a parameter set with a pair of a time constant and a scaling factor. A time constant and a scaling factor may have plural values depending on characteristics of an apparatus such as member, FIG. 8 shows an example of two values. Consequently, nine parameter sets are obtained every time constant and every scaling factor in advance and stored in the eddy current parameter storage part 40C.

When parameters as shown in FIG. 8 are prepared, an intensity of eddy correction gradient magnetic field pulse to be applied for cancelling the remnant magnetic field due to an eddy current at applying a pre-pulse can be calculated in the eddy correction gradient pulse generating part 40B.

Specifically, in case of applying an eddy correction gradient magnetic field pulse at the same timing as a pre-pulse, the intensity I of the eddy correction gradient magnetic field pulse can be calculated as expression (3).

$$I = rH_1\exp(-t_1/T) + rH_2\exp(-t_2/T) + rH_3\exp(-t_3/T) + \ldots + rH_n\exp(-t_n/T) \quad (3)$$

Note that, in expression (3), $H_i$ denotes an intensity of the i-th gradient magnetic field pulse in the order from the side closer to application timing of the pre-pulse toward the past, and $t_i$ denotes a difference between application times of the pre-pulse and the i-th gradient magnetic field pulse (i.e., a lapse time).

Specifically, a intensity I of eddy correction gradient magnetic field pulse can be calculated by integrating component values of eddy currents, in each axis direction, due to n gradient magnetic field pulses having intensities $H_1$, $H_2$, $H_3$, ..., $H_n$ having been applied in a period retrospective from the application timing of pre-pulse by a predetermined time, after attenuation according to a time constant T and lapse times $t_1$, $t_2$, $t_3$, ..., $t_n$. That is to say, a intensity I of eddy correction gradient magnetic field pulse can be calculated by integrating components of remaining eddy currents in a target axis direction, at every spatial position, generated by respective gradient magnetic field pulses having been applied before applying the pre-pulse.

The intensities $H_1$, $H_2$, $H_3$, ..., $H_n$ of gradient magnetic field pulses are known from the set pulse sequence. The intensity r(rx, ry, rz) and the time constant T of an eddy current generated by applying a gradient magnetic field having a unit intensity can be calculated with high accuracy by substituting a spatial position such as a slice excitation position into an approximate expression using the spatial position, coefficients a, b, c, and the scaling factor Sc as described above.

Alternatively, the intensity r(rx, ry, rz) and the time constant T of an eddy current generated by applying a gradient magnetic field having a unit intensity can be directly measured by the eddy measuring sequence mentioned above without using an approximate expression. For example, using a measurement result of the intensity and time constant of an eddy current at the closest position to a slice excitation position as the intensity r(rx, ry, rz) and the time constant T of the eddy current at the slice excitation position can lead to simplification of calculation.

Note that, the number n of component values of eddy currents attributed to gradient magnetic field pulses to be integrated is determined so that the lapse time $t_n$ becomes long enough. The component values of eddy currents attributed to all gradient magnetic field pulses can be set to integration targets. However, if component values of eddy currents attributed to a part of gradient magnetic field pulses determined so that the lapse time $t_n$ becomes long enough are set to integration targets, a processing amount can be reduced. The number n of component values of eddy currents to be targets of integration changes depending on characteristics of an apparatus. Specifically, it is thought that satisfactory accuracy can be obtained if the number n of component values of eddy currents to be targets of integration is determined so that the lapse time $t_n$ keeps around 10 seconds.

Since the term gradient magnetic field pulses here include all gradient magnetic field pulses such as flop spoiler pulses and MPG (motion probing gradient) pulses in DWI (diffusion weighted imaging), it is preferable that eddy currents generated by gradient magnetic field pulses, such as MPG pulses, each having a non-negligible high intensity after attenuation are to be targets of integration.

FIG. 9 is a diagram explaining a method for calculating an intensity of the eddy correction gradient magnetic field pulse shown in FIG. 5 in a target axis direction.

The abscissa axis in FIG. 9 denotes time. As shown in FIG. 9, the intensity I of the eddy correction gradient magnetic field pulse can be calculated by integrating component values of eddy currents, in a target axis direction, generated by applying the gradient magnetic field pulses with intensities $H_1$, $H_2$, $H_3$, ..., $H_n$ having been applied first, second, third, ..., n-th, after attenuation according to the lapse times $t_1$, $t_2$, $t_3$, ..., $t_n$.

Meanwhile, when an eddy correction gradient magnetic field pulse is applied prior to a pre-pulse, a remnant magnetic field due to the eddy correction gradient magnetic field pulse have only to become an integrated value of remnant magnetic fields due to the previous gradient magnetic field pulses. Therefore, the intensity I and the application timing $t_c$ of the eddy correction gradient magnetic field pulse can be calculated as expression (4).

$$rI\exp(-t_c/T) = rH_1\exp(-t_1/T) + rH_2\exp(-t_2/T) + rH_3\exp(-t_3/T) + \ldots + rH_n\exp(-t_n/T) \quad (4)$$

In expression (4), $t_c$ denotes a lapse time from an application timing of the eddy correction gradient magnetic field pulse to an application timing of the pre-pulse.

In this way, an approximate expression on a position, a time constant and an intensity of an eddy current can be created based on the time constant T in attenuation of the eddy magnetic field and a spatial distribution data in the intensity of the eddy current to calculate an application timing and an intensity I of the eddy correction gradient magnetic field pulse. Note that the shorter spatial distance between the pieces of remnant magnetic field data due to an eddy current leads to compensation of the remnant magnetic field with a higher degree of accuracy. A spatial position to calculate the intensities of the remnant magnetic field and the eddy correction gradient magnetic field pulse may be set to the respective slice excitation positions for example from the viewpoint of maintaining a necessary accuracy and simplification of calculation. However, the intensities of the remnant magnetic field and the eddy correction gradient magnetic field pulse can be calculated with regard to the center position and the edge positions of a FOV (field of view) in a phase encode (PE) direction and/or a readout (RO) direction according to an imaging purpose.

The above-described determination of the application timing and the intensity of the eddy correction gradient magnetic field pulse shown in FIG. 4 and FIG. 6 may be performed by the control of the gradient power supply 27 with the gradient power supply control computer 38, not on a pulse sequence. In this case, an eddy correction gradient magnetic field pulse is not being set on a pulse sequence but an eddy correction gradient magnetic field pulse having a predetermined intensity is applied at a predetermined application timing during an imaging.

Alternatively, a remnant magnetic field due to an eddy current can be compensated for by the pre-emphasis by the eddy compensation circuit 39 without applying an eddy correction gradient magnetic field pulse.

FIG. 10 is a chart showing a gradient magnetic field at an application timing of a pre-pulse in case of compensating a remnant magnetic field due to an eddy current by the eddy compensation circuit 39 shown in FIG. 1.

In FIG. 10, the abscissa denotes time. Further, in FIG. 10, G represents a gradient magnetic field and RF represents a fat saturation pulse as an example of a pre-pulse.

By performing the preemphasis by the eddy compensation circuit 39, the remnant magnetic field due to an eddy current shows a sufficiently low negligible intensity as shown by a dotted line in FIG. 10. Therefore, the eddy correction gradient magnetic field pulse is not applied at the application timing of the fat saturation pulse.

Figure 11:
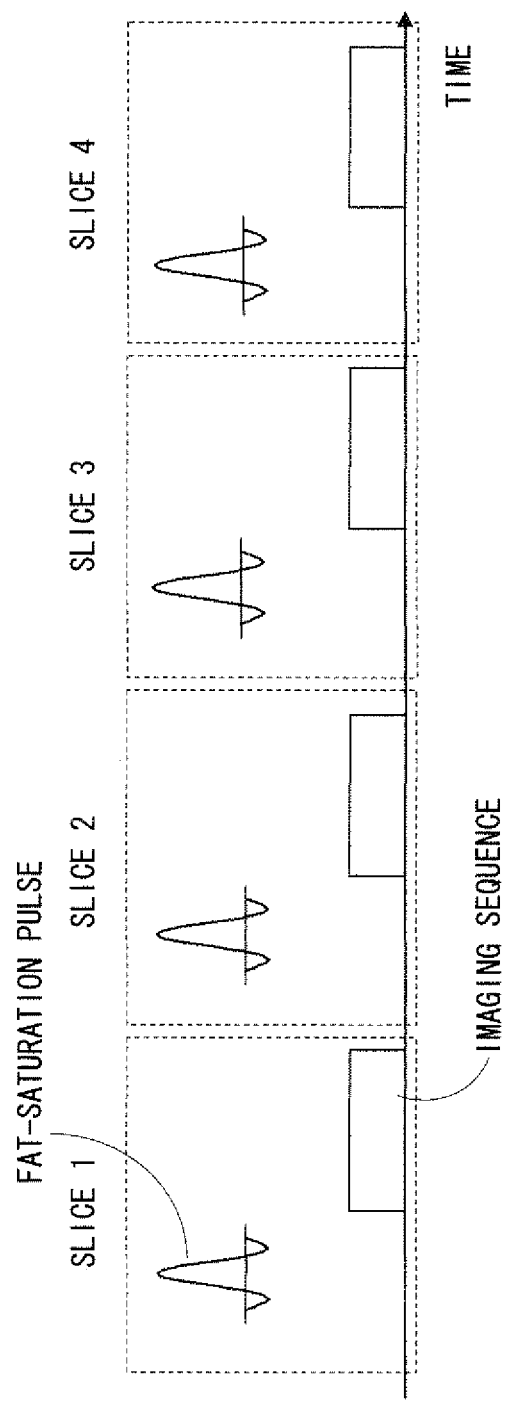
FIG. 11 is a sequence chart in case of compensating a remnant magnetic field due to an eddy current by the eddy compensation circuit as shown in FIG. 10.

FIG. 11 is a sequence chart in case of compensating a remnant magnetic field due to an eddy current by the eddy compensation circuit 39 as shown in FIG. 10.

In FIG. 11, the abscissa denotes time. As shown in FIG. 11, in case of performing a multi-slice imaging, a pulse sequence is set so that a fat saturation pulse is applied for each slice and subsequently data on a corresponding slice is acquired by performing an imaging sequence. Note that, an application of eddy correction gradient magnetic field pulse is not set since the remnant magnetic field due to an eddy current is suppressed by the pre-emphasis in the eddy compensation circuit 39.

Then, other functions of the computer 32 will be described.

The sequence controller control unit 41 has a function for controlling the driving of the sequence controller 31 by giving an imaging condition including a pulse sequence, received from the imaging condition setting unit 40, to the sequence controller 31 in response to information for instructing start of a scan from the input device 33. Further, the sequence controller control unit 41 has a function for receiving raw data from the sequence controller 31 and arranging the raw data in k-space formed in the k-space database 42. Therefore, the raw data generated by the receiver 30 is stored as k space data in the k-space database 42.

The image reconstruction unit 43 has a function for reconstructing image data from k-space data by capturing the k-space data from the k-space database 42 and performing image reconstruction processing including FT (Fourier transform) to the k-space data, and writing the generated image data to the image database 44. Therefore, the image database 44 stores the image data reconstructed in the image reconstruction unit 43.

The image processing unit 45 has a function for generating two-dimensional image data for displaying by performing necessary image processing to image data read form the image database 44 and displaying the generated image data on the display unit 34.

(Operation and Action)

Then, the operation and action of the magnetic resonance imaging apparatus 20 will be described.

In the magnetic resonance imaging apparatus 20, a remnant magnetic field due to an eddy current can be compensated for at an application timing of a pre-pulse in three ways. Specifically, three compensation methods of a remnant magnetic field can be performed in the magnetic resonance imaging apparatus 20. The first is setting an application of eddy correction gradient magnetic field pulse on a pulse sequence. The second is controlling the gradient power supply 27 by a control signal from the gradient power supply control computer 38 to apply an eddy correction gradient magnetic field pulse. The third is performing a pre-emphasis by the eddy compensation circuit 39. Put simply, controlling by software, controlling by hardware and controlling by circuits can be performed. Therefore, three methods will be explained in due order.

Figure 12:
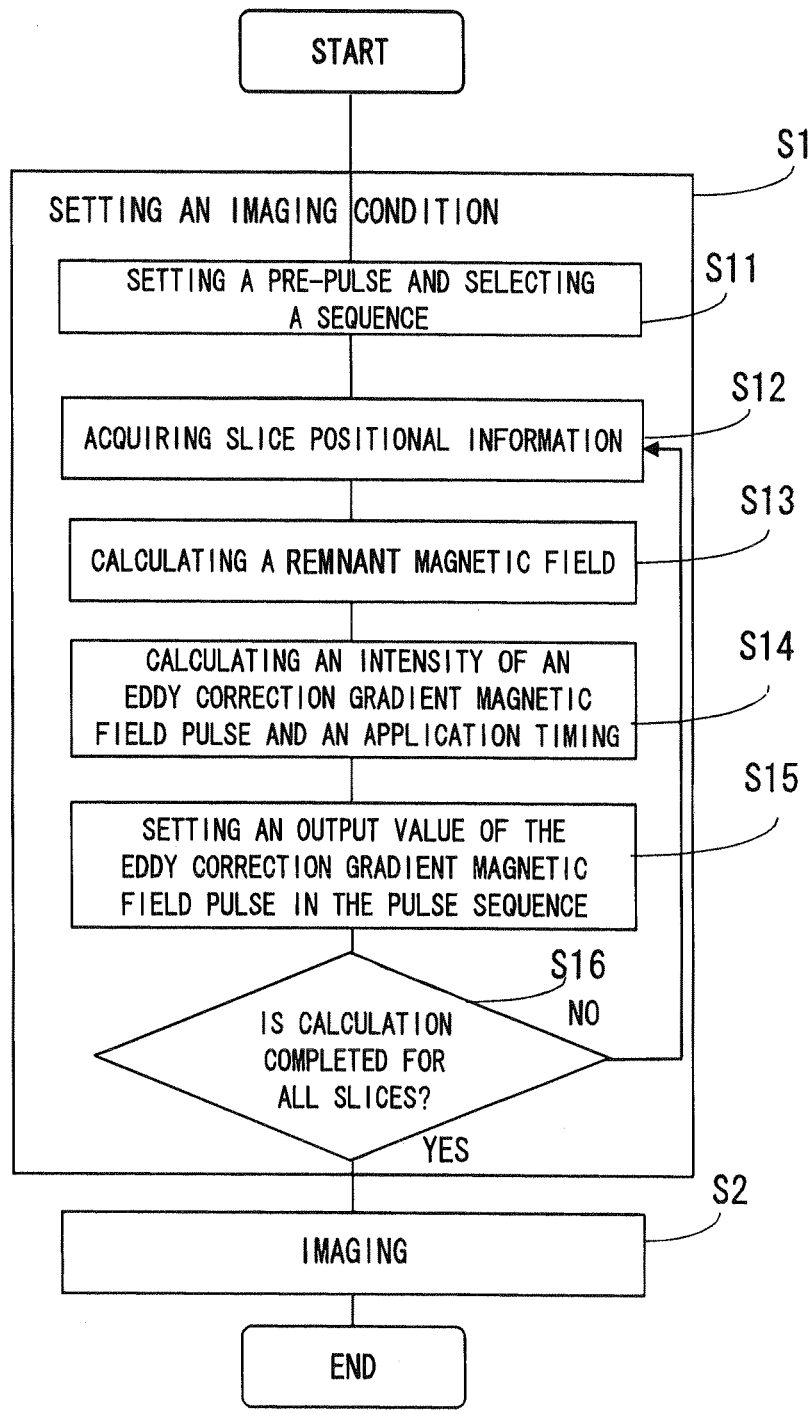
FIG. 12 is a flowchart showing a procedure for acquiring image data with compensating a remnant magnetic field by setting an application of eddy correction gradient magnetic field pulse on a pulse sequence in the magnetic resonance imaging apparatus shown in FIG. 1.

FIG. 12 is a flowchart showing a procedure for acquiring image data with compensating a remnant magnetic field by setting an application of eddy correction gradient magnetic field pulse on a pulse sequence in the magnetic resonance imaging apparatus 20 shown in FIG. 1. The symbols each including S with a number in FIG. 12 indicate respective steps of the flowchart.

First in the step S1, a pulse sequence with applications of a pre-pulse and an eddy correction gradient magnetic field pulse is set as an imaging condition in the imaging condition setting unit 40. Specifically, in the step S11, a type of pulse sequence for multi-slice imaging is selected and an application of a pre-pulse such as a fat saturation pulse for controlling a contrast is set in the pre-pulse setting part 40A.

Next, an intensity and an application timing of the eddy correction gradient magnetic field pulse to be applied in the sequence for data acquisition from each slice are set as a pre-calculation in the eddy correction gradient pulse generating part 40B. Specifically, in the step S12, positional information of a certain slice for data acquisition is acquired based on the pulse sequence. Then, in the step S13, an intensity of remnant magnetic field due to an eddy current at the slice position is calculated using the slice positional information and parameters with regard to an eddy current, such as intensities and/or time constants, concerned with respective spatial positions stored in the eddy current parameter storage unit 40C. Then, in the step S14, the intensity and the application timing of the eddy correction gradient magnetic field pulse are calculated so that the remnant magnetic field having the calculated intensity is cancelled. Then, in the step S15, the output value of the eddy correction gradient magnetic field pulse is set in the pulse sequence so that the eddy correction gradient magnetic field pulse is applied at the calculated intensity and application timing.

Then, in the step S16, it is determined whether calculation of the intensities and the application timings of the eddy correction gradient magnetic field pulses for all slices is completed or not. When slices about which calculation is not performed remain, positional information of another slice about which calculation is not performed is acquired in the step S1 again. Then, the processing from the step S12 is performed so that an output value of the eddy correction gradient magnetic field pulse is set in the pulse sequence.

On the other hand, in the step S16, when it is determined that calculation of the intensities the application timings of the eddy correction gradient magnetic field pulses and for all slices is completed, the setting of the imaging condition is completed. As a result, applications of the eddy correction gradient magnetic field pulses are set on the respective sequences for acquiring data from all slices at the intensities and the application timings according to the slice positions.

Subsequently, in step S2, imaging is performed according to the set imaging condition.

That is, the object P is set to the bed 37 in advance, and a static magnetic field is generated at an imaging area of the magnet 21 (a superconducting magnet) for static magnetic field excited by the static-magnetic-field power supply 26. Further, the shim-coil power supply 28 supplies current to the shim coil 22, thereby uniformizing the static magnetic field generated at the imaging area.

Then, the input device 33 sends instruction of imaging start to the sequence controller control unit 41. The sequence controller control unit 41 receives a pulse sequence from the imaging condition setting unit 40 and supplies the received pulse sequence to the sequence controller 31. Therefore, the sequence controller 31 drives the gradient power supply 27, the transmitter 29, and the receiver 30 in accordance with the pulse sequence received from the sequence controller control unit 41, thereby generating a gradient magnetic field at the imaging area having the set object P, and further generating RF signals from the RF coil 24.

Consequently, the RF coil 24 receives NMR signals generated due to nuclear magnetic resonance in the object P. Then, the receiver 30 receives the NMR signals from the RF coil 24 and generates raw data which is digital data of NMR signals by A/D conversion subsequently to necessary signal processing. The receiver 30 supplies the generated raw data to the sequence controller 31. The sequence controller 31 supplies the raw data to the sequence controller control unit 41. The sequence controller control unit 41 arranges the raw data as k-space data to the k space formed in the k-space database 42.

Subsequently, the image reconstruction unit 43 reads the k-space data from the k-space database 42 and performs image reconstruction processing to the read k-space data, thereby reconstructing image data. The reconstructed image data is written in the image database 44. Subsequently, the image processing unit 45 reads the image data form the image database 44 and performs necessary image processing, thereby generating two-dimensional image data for display. Thus, the generated image data for display is displayed on the display unit 34.

The image data displayed in this way has been acquired with applying the pre-pulse to control the contrast and the eddy correction gradient magnetic field pulse to cancel the remnant magnetic field due to the eddy current having a more than first order of spatial distribution at the application timing of the pre-pulse. Consequently, image data with an improved contrast can be acquired with no effect of the eddy current.

That is, the first compensation method calculates intensities and application timings of eddy correction gradient magnetic field pulses for all slices at the time of setting an imaging condition prior to a start of imaging and sets the eddy correction gradient magnetic field pulses in a pulse sequence to perform the imaging. In this case, the hardware such as the gradient power supply 27 outputs the eddy correction gradient magnetic field pulses according to the pulse sequence.

Figure 13:
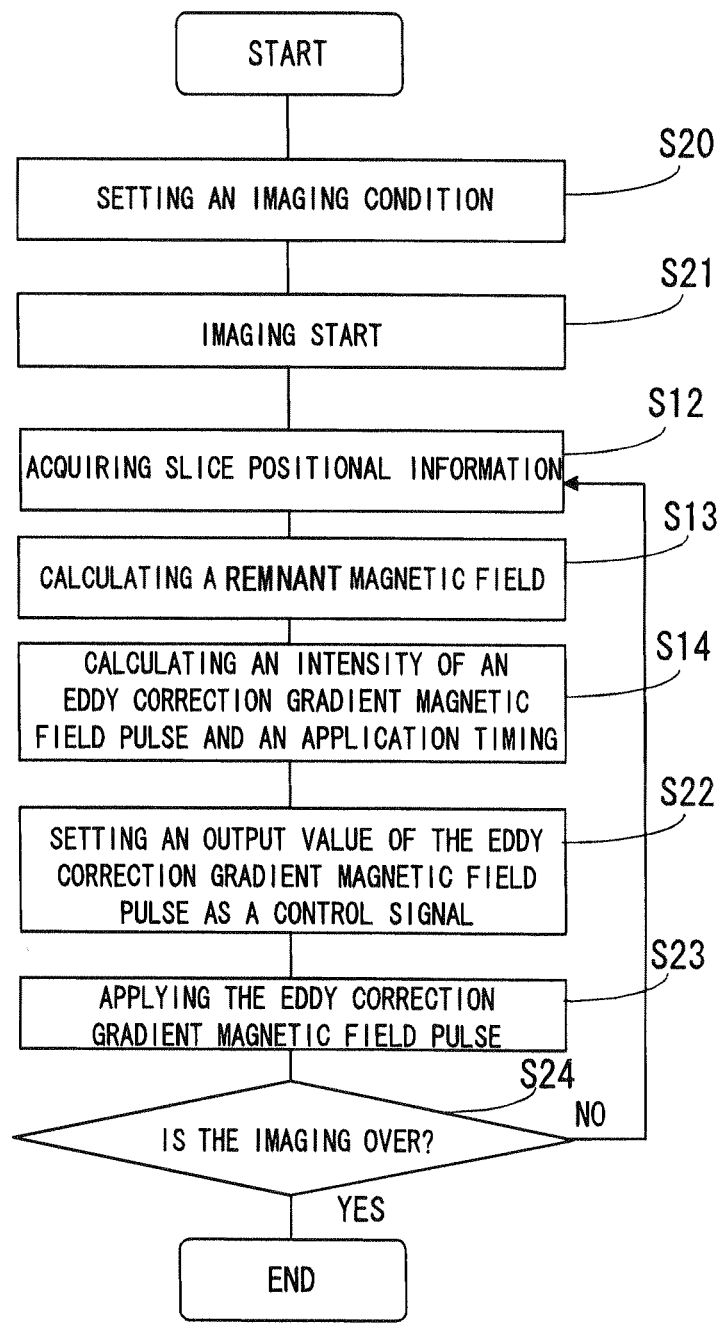
FIG. 13 is a flowchart showing a procedure for acquiring image data with compensating a remnant magnetic field by controlling the gradient power supply to apply an eddy correction gradient magnetic field pulse in the magnetic resonance imaging apparatus shown in FIG. 1.

FIG. 13 is a flowchart showing a procedure for acquiring image data with compensating a remnant magnetic field by controlling the gradient power supply 27 to apply an eddy correction gradient magnetic field pulse in the magnetic resonance imaging apparatus 20 shown in FIG. 1. The symbols each including S with a number in FIG. 13 indicate respective steps of the flowchart. Note that, the same symbols are attached with steps in FIG. 13 similarly to those in FIG. 12 and explanations of the steps in FIG. 13 are omitted.

First in the step S20, a pulse sequence with application of a pre-pulse and without application of an eddy correction gradient magnetic field pulse is set as an imaging condition by the imaging condition setting unit 40. Then in the step S21, an imaging is started and the pulse sequence corresponding to the slice of which data is to be acquired initially is output from the sequence controller 31 to the gradient power supply 27.

Then, the gradient power supply control computer 38 references the pulse sequence acquired from the gradient power supply 27, and performs acquisition of slice positional information, calculation of a remnant magnetic field, and calculation of an intensity and an application timing of an eddy correction gradient magnetic field pulse in the step S12 to the step S14 similarly to the processing shown in FIG. 12. For calculating the remnant magnetic field, parameters with regard to an eddy current such as a time constant and an intensity on each spatial position stored in a storage unit in the gradient power supply control computer 38 are referenced.

Then, in the step S22, the gradient power supply control computer 38 sets an output value of the eddy correction gradient magnetic field pulse in a control signal and outputs the control signal to the gradient power supply 27. Consequently, in the step S23, the eddy correction gradient magnetic field pulse is applied from the gradient coil 23 by the control of the gradient power supply 27.

Then, in the step S24, the gradient power supply control computer 38 determines whether data acquisition from all slices has been completed, i.e., whether the imaging has been over. Then, in case where any slice of which data has not been acquired remains, processing and operation in the step S12 to the step S23 are repeated again for a slice of which data has not been acquired. On the other hand, when it is determined that the imaging has been completed, processing and operation with regard to the eddy correction gradient magnetic field pulse are completed.

That is, the second compensation method performs calculations of the intensity and the application timing of the eddy correction gradient magnetic field pulse, in the gradient power supply control computer 38 attached to the gradient power supply 27, in real time following the change of a slice position excited during an imaging and applies the eddy correction gradient magnetic field pulse. Note that, if an intensity and an application timing of eddy correction gradient magnetic field pulse are calculated during an idle time generated in an ECG-gated imaging or a breath-gated imaging, a time loss due to the calculation can be shortened compared to a case where an application of eddy correction gradient magnetic field pulse is set in a pulse sequence.

Figure 14:
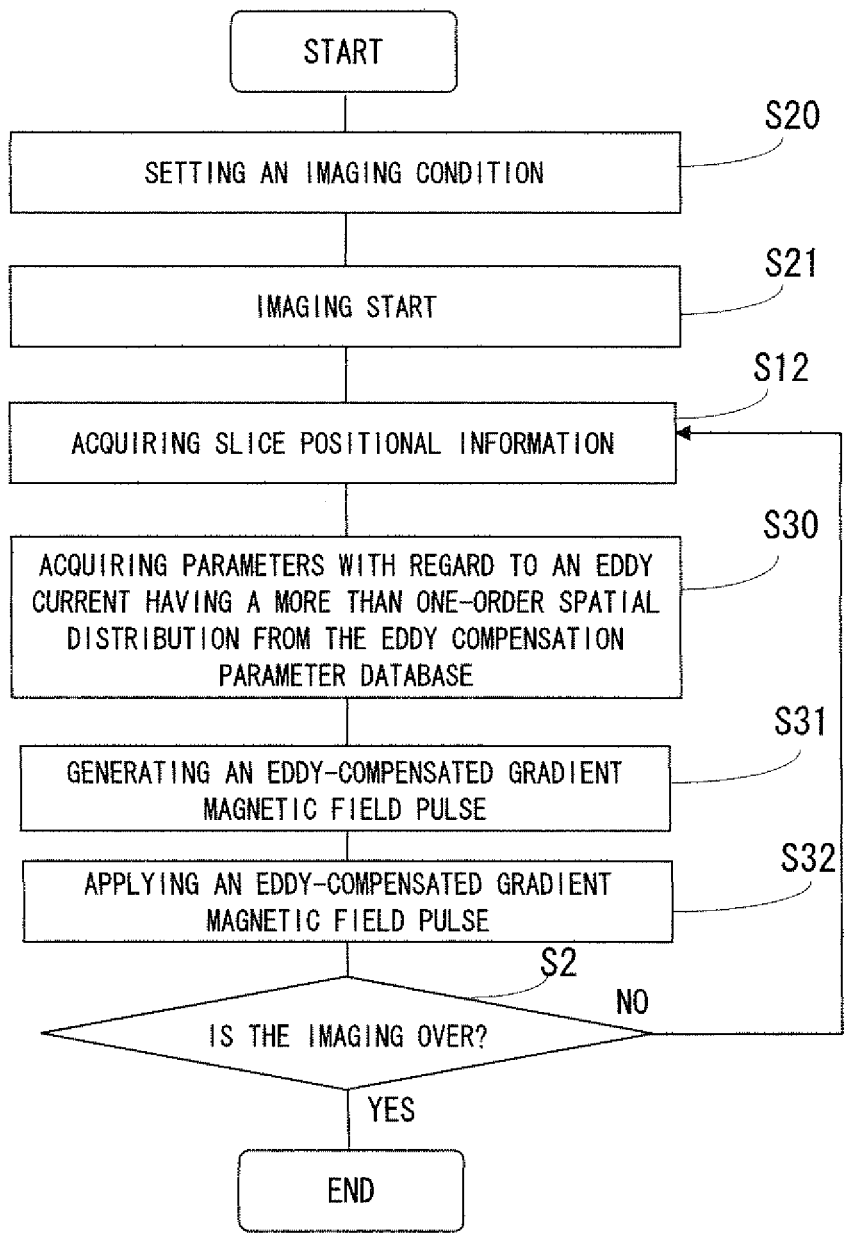
FIG. 14 is a flowchart showing a procedure for acquiring image data with compensating a remnant magnetic field by the eddy compensation circuit in the magnetic resonance imaging apparatus shown in FIG. 1.

FIG. 14 is a flowchart showing a procedure for acquiring image data with compensating a remnant magnetic field by the eddy compensation circuit 39 in the magnetic resonance imaging apparatus 20 shown in FIG. 1. The symbols each including S with a number in FIG. 14 indicate respective steps of the flowchart. Note that the same symbols are attached with steps in FIG. 14 similarly to those in FIG. 12 and FIG. 13 and explanations of the steps in FIG. 14 are omitted.

First, in the step S20, an imaging condition is set. Subsequently, an imaging is started in the step S21. Specifically, a pulse sequence corresponding to a slice of which data is to be acquired initially is output from the sequence controller 31 to the eddy compensation circuit 39.

Then, the eddy compensation circuit 39 references the pulse sequence acquired from the sequence controller 31 and acquires slice positional information in the step S12 as well as the processing shown in FIG. 12.

Then, in the step S30, the eddy compensation circuit 39 references parameters for each spatial position, to calculate an intensity of remnant magnetic field due to an eddy current having a more than first order of spatial distribution, stored in the eddy compensation parameter database 39A. Then, the eddy compensation circuit 39 acquires parameters corresponding to the slice position. Specifically, though the first mode that the eddy compensation circuit 39 reads parameters with regard to an eddy current having a zero order or a first order of spatial distribution from the eddy compensation parameter database 39A is usually being set, the first mode is switched to the second mode that the eddy compensation circuit 39 reads parameters with regard to an eddy current having a more than first order of spatial distribution from the eddy compensation parameter database 39A.

Then, in the step S31, the eddy compensation circuit 39 generates an eddy-compensated gradient magnetic field pulse by correcting the gradient magnetic field waveform based on the parameters corresponding to the slice position so as to prevent an eddy current.

Then, in the step S32, the eddy compensation circuit 39 outputs the eddy-compensated gradient magnetic field pulse to the gradient power supply 27. Consequently, the eddy-compensated gradient magnetic field pulse is applied from the gradient coil 23 by the control of the gradient power supply 27.

Then, in the step S24, the eddy compensation circuit 39 determines whether the imaging has been over. Then, when any slice of which data has not been acquired remains, processing and operation in the step S12 to the step S32 are repeated again. On the other hand, when it is determined that the imaging has been completed, processing and operation with regard to an eddy-compensated gradient magnetic field pulse are completed.

That is, in the third compensation method, parameters corresponding to respective spatial positions such as time constants and intensities for an eddy current having a second order of spatial distribution are stored in the eddy compensation parameter database 39A, and the eddy compensation circuit 39 acquires the parameters with regard to an eddy current corresponding to the slice position excited in an imaging from the eddy compensation parameter database 39A to perform the pre-emphasis corresponding to the eddy current having the second order of spatial distribution. As a result, the remnant magnetic field itself before application of a pre-pulse is sufficiently suppressed to a negligible degree. Consequently, the contrast can be controlled satisfactorily by applying the pre-pulse without applying an eddy correction gradient magnetic field pulse.

Note that, in the third compensation method, the conventional pre-emphasis to an eddy current having a zero order or a first order of distribution may also be performed after application of a pre-pulse. In this case, to perform the pre-emphasis on the second order of eddy current constantly before and after applying a pre-pulse leads to an easier control since a switching operation between the first mode and the second mode is needed.

The foregoing magnetic resonance imaging apparatus 20 is an apparatus to compensate an eddy current having a more than first order of spatial distribution generated due to gradient magnetic fields applied before application of a pre-pulse. Specifically, in the magnetic resonance imaging apparatus 20, an eddy correction gradient magnetic field pulse is applied so that a remnant magnetic field due to an eddy current is canceled, or a pre-emphasis on an eddy current having a second order of spatial distribution is performed.

Consequently, according to the magnetic resonance imaging apparatus 20, even if a time constant and an intensity of an eddy current vary spatially, i.e., the eddy current has a second order of spatial distribution, a remnant magnetic field due to the eddy current can be compensated in the vicinity of an excited slice. As a result, the effect of application of a pre-pulse such as a fat saturation pulse can be improved. Especially, when a fat saturation pulse is applied, a uniformity of magnetic field at an off-center where a nonlinearly remnant magnetic field distributing spatially due to an eddy current is remarkable can be improved so that a fat suppression effect is improved.

What is claimed is:

1. A magnetic resonance imaging apparatus comprising:
an imaging unit configured to acquire image data after applying a radio frequency (RF) pre-pulse configured for controlling contrast when the image data is subsequently acquired; and
a compensation unit configured to suppress a remnant eddy current magnetic field having different intensities according to slice positions, such that the remnant eddy current magnetic field becomes substantially zero at the pre-pulse application time and remnant eddy current magnetic field is caused by an eddy current generated by at least one gradient magnetic field applied before applying the pre-pulse.

2. The magnetic resonance imaging apparatus of claim 1, wherein:
said compensation unit is configured to apply a gradient magnetic field correction pulse in order to cancel the remnant eddy current magnetic field.

3. The magnetic resonance imaging apparatus of claim 1 wherein: said compensation unit is configured to apply a gradient magnetic field correction pulse having an opposite polarity in order to cancel the remnant eddy current magnetic field at the RF pre-pulse application time.

4. The magnetic resonance imaging apparatus of claim 1, wherein:
said compensation unit is configured to apply a gradient magnetic field correction pulse before applying the pre-pulse and thereby cancel the remnant eddy current magnetic field that was caused by the gradient magnetic field by generating an opposite remnant eddy current magnetic field to that generated by the gradient magnetic field correction pulse.

5. The magnetic resonance imaging apparatus of claim 1, wherein:
said compensation unit includes a compensation circuit configured to suppress the remnant eddy current magnetic field by controlling a gradient magnetic field waveform used in the acquisition of the image data.

6. The magnetic resonance imaging apparatus of claim 1, wherein:
said imaging unit is configured to apply a fat saturation RF pulse in order to suppress fat as the RF pre-pulse.

7. The magnetic resonance imaging apparatus of claim 1, wherein:
said imaging unit is configured to apply one of:
(a) a water selective excitation pulse that excites water selectively,
(b) a saturation pulse that saturates spins in a desired matter in order to suppress signals from the desired matter,
(c) a spin labeling pulse that tags a moving object flowing into an imaging section,
(d) a magnetization transfer contrast pulse for saturating a magnetization of protons in bound water in order to suppress signals from a parenchymatous organ, and
(e) a slice-selective off-resonance sinc pulse which is a magnetization transfer contrast pulse applied together with a slice selection gradient magnetic field as the RF pre-pulse, the saturation pulse being applied before a dephasing gradient magnetic field pulse.

8. The magnetic resonance imaging apparatus of claim 1, wherein:
said compensation unit is configured to set an application of a gradient magnetic field correction pulse in order to cancel the remnant eddy current magnetic field during an image data acquisition pulse sequence as an imaging condition.

9. The magnetic resonance imaging apparatus of claim 1, wherein said compensation unit is configured to apply a gradient magnetic field correction pulse that cancels the remnant eddy current magnetic field by controlling a gradient power supply during the acquisition of imaging data, the gradient power supply supplying current to a gradient coil in order to apply said gradient magnetic field correction pulse.

10. The magnetic resonance imaging apparatus of claim 1, further comprising an eddy current parameter storage unit configured to store information of an eddy current having a more than first order spatial distribution, wherein said compensation unit is configured to suppress the remnant eddy current magnetic field using the stored information.

11. The magnetic resonance imaging apparatus of claim 1, wherein:
said compensation unit is configured to suppress the remnant eddy current magnetic field using information of an eddy current having more than a first order spatial distribution, said information being obtained by performing an eddy current measuring sequence prior to actual MRI imaging.

12. The magnetic resonance imaging apparatus of claim 1, wherein; said compensation unit is configured to suppress the remnant eddy current magnetic field by obtaining remnant eddy current magnetic fields due to the eddy current at plural slice positions excited during acquisition of the imaging data.

13. The magnetic resonance imaging apparatus of claim 12, wherein:
said compensation unit is configured to suppress the remnant eddy current magnetic field by applying gradient magnetic field correction pulses having mutually different intensities according to respectively corresponding plural slice positions.

14. The magnetic resonance imaging apparatus of claim 1, wherein:
said compensation unit is configured to suppress a remnant eddy current magnetic field having an intensity which varies linearly on a single slice position and having a variation in gradient which varies at a second order and above as well as gradient variation between slice positions.

15. The magnetic resonance imaging method comprising:
acquiring image data after applying a radio frequency (RF) pre-pulse configured for controlling contrast when the image data is subsequently acquired; and
suppressing a remnant eddy current magnetic field having different intensities according to slice positions, such that the remnant eddy current magnetic field becomes substantially zero at the pre-pulse application time and any remaining remnant eddy current magnetic field is caused by an eddy current generated by at least one gradient magnetic field applied before applying the pre-pulse.

* * * * *